(12) United States Patent
Sabathil et al.

(10) Patent No.: US 8,530,923 B2
(45) Date of Patent: Sep. 10, 2013

(54) LED CHIP

(75) Inventors: Matthias Sabathil, Regensburg (DE);
Lutz Hoeppel, Alteglofsheim (DE);
Andreas Weimar, Regensburg (DE);
Karl Engl, Niedergebraching (DE);
Johannes Baur, Regensburg (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 0 days.

(21) Appl. No.: 12/922,830

(22) PCT Filed: Apr. 28, 2009

(86) PCT No.: PCT/DE2009/000629
§ 371 (c)(1),
(2), (4) Date: Jan. 4, 2011

(87) PCT Pub. No.: WO2009/132641
PCT Pub. Date: Nov. 5, 2009

(65) Prior Publication Data
US 2011/0114988 A1    May 19, 2011

(30) Foreign Application Priority Data

Apr. 30, 2008 (DE) .......................... 10 2008 021 675
Jul. 31, 2008 (DE) .......................... 10 2008 035 900

(51) Int. Cl.
*H01L 33/38* (2010.01)

(52) U.S. Cl.
USPC ............... 257/99; 257/79; 257/81; 257/85; 257/91; 257/94; 257/96; 257/97; 257/98; 257/E33.063; 257/E33.064; 257/E33.065

(58) Field of Classification Search
USPC .............. 257/79, 81, 85, 91, 94, 96–99
See application file for complete search history.

(56) References Cited

U.S. PATENT DOCUMENTS

| 5,917,202 | A | 6/1999 | Haitz et al. |
| 6,784,462 | B2 * | 8/2004 | Schubert ........................ 257/98 |
| 7,012,279 | B2 * | 3/2006 | Wierer, Jr. et al. ............... 257/94 |
| 7,119,372 | B2 * | 10/2006 | Stokes et al. .................... 257/79 |
| 7,135,709 | B1 | 11/2006 | Wirth et al. |
| 7,642,183 | B2 * | 1/2010 | Zhao et al. .................... 438/609 |
| 7,683,380 | B2 * | 3/2010 | Lee et al. ........................ 257/79 |
| 2003/0111667 | A1 | 6/2003 | Schubert |
| 2004/0119085 | A1 | 6/2004 | Bader et al. |

(Continued)

FOREIGN PATENT DOCUMENTS

| DE | 199 47 030 | 4/2001 |
| DE | 10 2005 003 460 | 10/2005 |

(Continued)

*Primary Examiner* — Matthew W Such
*Assistant Examiner* — David Spalla
(74) *Attorney, Agent, or Firm* — Cozen O'Connor

(57) ABSTRACT

A light-emitting diode chip (1) with a semiconductor layer sequence (2) is described, which is contacted electrically by contacts (5) via a current spreading layer (3). The contacts (5) cover around 1%-8% of the surface of the semiconductor layer sequence (2). The contacts (5) consist for example of separate contact points (51), which are arranged at the nodes of a regular grid (52) with a grid constant of 12 μm. The current spreading layer (3) contains for example indium-tin oxide, indium-zinc oxide or zinc oxide and has a thickness in the range from 15 nm to 60 nm.

17 Claims, 6 Drawing Sheets

(56) References Cited

U.S. PATENT DOCUMENTS

| | | |
|---|---|---|
| 2005/0087884 A1 | 4/2005 | Stokes et al. |
| 2005/0199888 A1 | 9/2005 | Seong et al. |
| 2006/0273335 A1* | 12/2006 | Asahara et al. ............. 257/98 |
| 2007/0278508 A1 | 12/2007 | Baur et al. |
| 2008/0093612 A1 | 4/2008 | Konno et al. |
| 2010/0171135 A1 | 7/2010 | Engl et al. |
| 2010/0208763 A1 | 8/2010 | Engl et al. |
| 2010/0213485 A1* | 8/2010 | McKenzie et al. ............. 257/98 |

FOREIGN PATENT DOCUMENTS

| | | |
|---|---|---|
| DE | 10 2004 061 865 | 3/2006 |
| DE | 10 2005 025 416 | 12/2006 |
| DE | 102 44 986 | 2/2008 |
| DE | 10 2007 022 947 | 10/2008 |
| DE | 10 2007 029 370 | 11/2008 |
| DE | 10 2008 005 332 | 6/2009 |
| WO | WO 2004/112157 | 12/2004 |
| WO | WO 2005/013382 | 2/2005 |
| WO | WO 2009/068015 | 6/2009 |

* cited by examiner

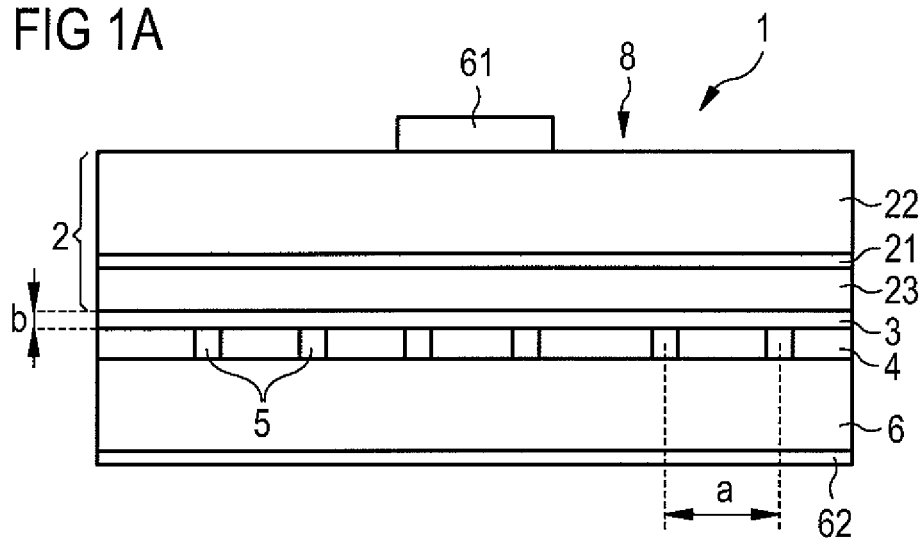
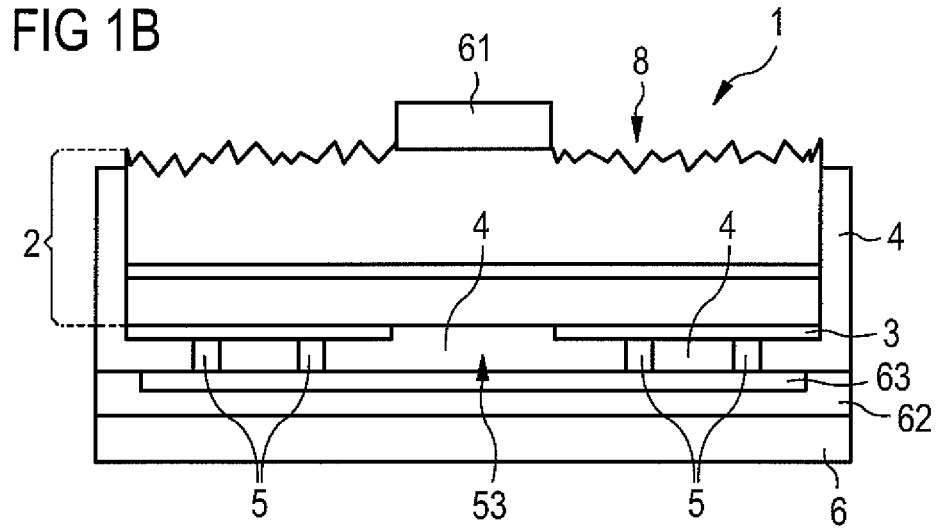

LED CHIP

RELATED APPLICATIONS

This is a U.S. national stage of application No. PCT/DE2009/000629, filed on Apr. 28, 2009.

This application claims the priority of German application no. 10 2008 021 675.5 filed Apr. 30, 2008 and 10 2008 035 900.9 filed Jul. 31, 2008, the entire content of both of which are hereby incorporated by reference.

FIELD OF THE INVENTION

The present invention is related to a light-emitting diode chip with a semiconductor layer sequence, which comprises an active zone for generating electromagnetic radiation.

BACKGROUND OF THE INVENTION

The light yield of light-emitting diode chips is influenced by various factors. By means of suitable electrical contacting of the light-emitting diode chip it is possible to achieve good internal quantum efficiency. At the same time, however, contacting constitutes a possible absorption source for the generated radiation, so limiting outcoupling efficiency and thus the light yield of the light-emitting diode chip.

SUMMARY OF THE INVENTION

One object of the invention is to increase the light yield of light-emitting diode chips.

A light-emitting diode chip with a semiconductor layer sequence is provided, which comprises an active zone for generating electromagnetic radiation. To generate radiation, the semiconductor layer sequence is contacted electrically.

Applied to the semiconductor layer sequence is a current spreading layer, which is contacted electrically by means of contacts. For example, the contacts cover 1%-8% of the current spreading layer, and particularly preferably they cover 2%-4% of the current spreading layer.

When contacting the semiconductor layer sequence by way of a current spreading layer, it is possible to achieve particularly uniform current distribution. The absorption of radiation at the contacts is minimised by the small contact surface. A degree of coverage of 1%-8% and in particular of 2%-4% represents a good compromise between sufficient power supply and tenable absorption.

In this case, surface coverage of the semiconductor layer sequence relates to the sum of the cross-sectional areas of the contacts at the interface with the current spreading layer.

The charge carriers are injected via the contacts into the current spreading layer and distributed uniformly laterally in the current spreading layer. From the current spreading layer they enter the semiconductor layer. A p-doped semiconductor layer generally comprises only low transverse conductivity and may therefore only bring about insufficient lateral distribution of the charge carriers. It is therefore particularly advantageous here for the charge carriers to be distributed uniformly laterally by means of a current spreading layer before they are injected into the semiconductor layer.

The contacts are preferably distributed uniformly over the surface of the current spreading layer.

This results in a particularly uniform lateral distribution of the charge carriers in the current spreading layer.

In an advantageous embodiment the contacts take the form of separate contact points. A contact is designated a contact point if it covers the current spreading layer only in point-like manner.

The contact points are preferably distributed uniformly over the surface of the current spreading layer.

In a preferred embodiment neighbouring contact points are arranged with a spacing of less than 30 µm, in particular of less than or equal to 12 µm.

The contacts are for example arranged at nodes of a regular grid. The grid constant of the grid is preferably less than 30 µm. It is particularly advantageous if the grid constant is less than or equal to 12 µm.

The grid constant then corresponds to the spacing between neighbouring contact points. The cross-sectional area of the individual contact points preferably decreases as the grid constant likewise decreases. This ensures that the contacts cover a total of only 1%-8% and particularly preferably only 2%-4% of the surface of the current spreading layer even with a relatively small grid constant. The area of a contact point results directly from the contact spacing and the average surface coverage.

In one advantageous configuration a free region is formed at the interface between the current spreading layer and the contacts, in which region the current spreading layer is not covered by contacts. The surface coverage of the free region is for example similar in magnitude to the surface coverage of the contacts. If the contacts are arranged at the nodes of a regular grid, the nodes of the grid located in the free region are free of contacts. In this case, for example, the free region is as large as the region of the current spreading layer in which the nodes of the grid are free of contacts. In one embodiment the free region takes the form of a frame and surrounds the contacts. For example, the width of a frame portion lies in the range from at least 1 µm to at most 10 µm.

The free region is preferably provided in a region in which a particularly large proportion of the generated radiation arises, since in this way absorption of the radiation may be reduced particularly effectively. The majority of the radiation is generated in a central region of the active zone of the semiconductor layer sequence. For this reason, a particularly large amount of radiation also impinges on a region of the current spreading layer which is located perpendicularly below this central region. The provision of a free region there is therefore particularly favourable. The area of the free region is preferably selected such that maximally uniform current distribution is ensured.

In one embodiment the contacts are configured such that their thermal conductivity increases as the spacing from the semiconductor layer sequence increases.

It may in this way be ensured that the contacts provide good dissipation of the heat generated in the active zone, without their leading to elevated absorption of the radiation. In the vicinity of the semiconductor layer sequence the contacts exhibit low absorbency for generated radiation. This is usually accompanied by low thermal conductivity. For example, the contacts are reflected at the boundary to the current spreading layer. With increasing distance from the semiconductor layer sequence, a smaller proportion of the radiation impinges on the contacts or further constituents of the light-emitting diode chips due to reflection and absorption of the radiation. For this reason, when configuring the contacts less consideration has here to be paid to absorption of the radiation and the contacts may be optimised in terms of their thermal conductivity.

An increase in thermal conductivity with increasing distance from the semiconductor layer sequence may be achieved for example by an increase in the cross-sectional areas of the contacts. The contacts are for example conical in form.

Preferably, a dielectric layer adjoins the side of the current spreading layer which is remote from the semiconductor layer sequence. Since the dielectric layer exhibits only slight electrical conductivity, the contacts are passed therethrough and are in electrical contact with the current spreading layer.

The dielectric layer serves to reflect back the impinging radiation into the semiconductor layer sequence with as little loss as possible. The reflected radiation may then leave the light-emitting diode chip for example through a top outcoupling region. The dielectric layer thus increases the outcoupling efficiency of the light-emitting diode chip. This is particularly advantageous for thin-film light-emitting diode chips or in the case of a flip chip structure.

The dielectric layer takes the form, for example, of a Bragg mirror, in which dielectric sublayers with high and low refractive indices are alternately arranged.

In one advantageous embodiment the dielectric layer comprises a particularly low refractive index. In this way, the largest possible proportion of the radiation is reflected. For example, the dielectric layer contains a low-k- or an ultra low-k material. The dielectric layer may also be an air layer. This means that the contacts may be surrounded at least in places by an air layer.

In one embodiment of the light-emitting diode chip, a metallic layer is located on the side of the dielectric layer which is remote from the semiconductor layer sequence. The contacts preferably adjoin the metallic layer.

The metallic layer makes it possible for the part of the radiation which has not been reflected by the dielectric layer to be reflected back into the semiconductor layer sequence.

In one embodiment the light-emitting diode chip comprises an electrically conductive carrier. In this case the semiconductor layer sequence may be electrically connected by means of a bottom contact which is located on the outside of the carrier. The charge carriers may then be injected via the bottom contact, the carrier, the metallic layer, the contacts and the current spreading layer into the semiconductor layer sequence.

In one advantageous embodiment of the light-emitting diode chip, the current spreading layer is configured such that it absorbs the smallest possible proportion of generated radiation. However, uniform current distribution has to be ensured in this case.

The inventors have established that a current spreading layer with a thickness in the range from 10 nm to 60 nm represents a good compromise between minimising absorption and maximising transverse conductivity.

In this case, the optimum thickness of the current spreading layer also depends on the material used. For example, the current spreading layer contains a transparent conductive oxide (TCO) such as indium-tin oxide (ITO), indium-zinc oxide (IZO) or zinc oxide (ZnO).

Preferably, an ITO layer has a thickness of at least 15 nm, an IZO layer a thickness of at least 30 nm and a ZnO layer a thickness of at least 40 nm.

In a particularly advantageous embodiment of the light-emitting diode chip, the arrangement of the contacts, the form of the contacts, the thickness of the current spreading layer and the material of the current spreading layer are all matched to one another and optimised. For example, when the contacts are spaced by a relatively small amount, the thickness of the current spreading layer may be reduced.

BRIEF DESCRIPTION OF THE DRAWINGS

The stated semiconductor chip and its advantageous configurations are explained below with reference to schematic figures, which are not to scale and in which:

FIG. 1A is a cross-sectional representation of a light-emitting diode chip with electrical contacts which adjoin a current spreading layer, FIG. 1B shows a further embodiment of a light-emitting diode chip with electrical contacts which adjoin a current spreading layer.

DETAILED DESCRIPTION OF THE DRAWINGS

Figure 2A:
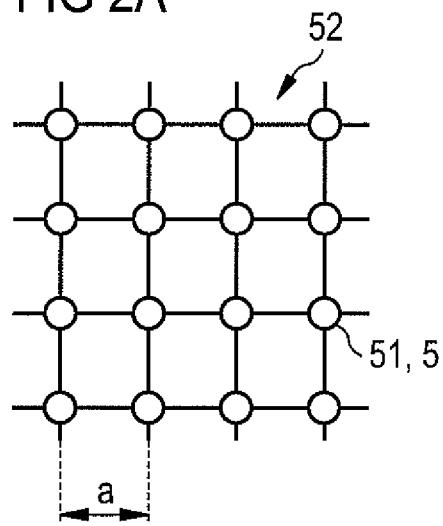
FIG. 2A is a plan view of a regular grid, with contact points arranged at the nodes thereof.

FIG. 1A shows a light-emitting diode chip 1, which comprises a semiconductor layer sequence 2 with an active zone 21 for generating electromagnetic radiation. The active zone 21 is located between two semiconductor layers 22, 23. In this exemplary embodiment the semiconductor layer 23 is p-doped, and the semiconductor layer 22 n-doped. The semiconductor layers 22, 23 are based for example on gallium nitride, and the active zone 21 on indium gallium nitride.

The semiconductor layers 21, 22, 23 may be grown epitaxially and preferably exhibit a total thickness of less than 20 µm, in particular of less than 10 µm. In particular, the light-emitting diode chip 1 may be a thin-film light-emitting diode chip.

A top contact 61 and a bottom contact 62 are provided for electrical contacting of the light-emitting diode chip. For example, the top contact 61 takes the form of a bond pad and is connected with a bonding wire (not shown). The bottom contact 62 is connected for example to a conductive track structure of a printed circuit board (not shown).

The bottom contact 62 is arranged on the outside of a carrier 6 of the light-emitting diode chip 1. The carrier 6 is electrically conductive and comprises for example semiconductor materials, such as silicon, silicon carbide, gallium arsenide, gallium nitride or germanium.

In an alternative embodiment the carrier 6 may also consist of a non-conductive material. The contacts 5 are then preferably passed through the carrier 6.

By means of contacts 5, an electrical connection is produced between the carrier 6 and the semiconductor layer sequence 2. The contacts 5 adjoin a current spreading layer 3, which in turn adjoins the p-doped semiconductor layer 23. In other embodiments the contacts 5 may also project into the current spreading layer 3.

The contacts 5 are uniformly distributed over the surface of the semiconductor layer sequence 2. The spacing a of two neighbouring contacts 5 is preferably less than 24 μm, particularly preferably less than 12 μm.

The current spreading layer 3 preferably exhibits a thickness b in the range from 10 nm to 60 nm. It contains a transparent conductive oxide (TCO) for example indium-tin oxide (ITO), indium-zinc oxide (IZO) or zinc oxide (ZnO). The current spreading layer 3 is sputtered onto the semiconductor layer 23, for example.

Between the current spreading layer 3 and the carrier 6 there is located a dielectric layer 4, through which the contacts 5 are passed. The dielectric layer 4 serves to reflect impinging radiation back into the semiconductor layer sequence 2, such that this may leave the light-emitting diode chip 1 through a top outcoupling region 8. The dielectric layer 4 contains silicon dioxide, for example. In further embodiments the dielectric layer 4 may contain a material which has a particularly low refractive index. The dielectric layer 4 may in particular also be an air layer.

To produce the contacts 5, recesses may be introduced into the dielectric layer 4 in a photolithographic process and filled with a conductive material, for example a metal.

FIG. 1B shows a further embodiment of a light-emitting diode chip 1. Here a free region 53 is formed, in which the semiconductor layer sequence 2 is not covered by contacts 5. The free region 53 is arranged centrally relative to the area of the semiconductor layer sequence 2. Since the majority of the radiation is also generated in a central region of the active zone 21, the majority of the radiation impinges at that point. Due to the central arrangement of the free region 52, absorption of the radiation at the contacts 5 may thus be particularly effectively reduced.

In addition, in a central region the dielectric layer 4 passes through the current spreading layer 3 and directly adjoins the p-doped semiconductor layer 23. This leads to absorption of the radiation in the current spreading layer 3 being reduced precisely in this central region.

The dielectric layer 4 is closed off in the direction of the carrier 6 by a metallic layer 63. The metallic layer 63 is suitable for reflecting radiation which was not reflected by the dielectric layer 4 back into the semiconductor layer sequence 2. The metallic layer 63 is applied to the dielectric layer 4 for example by sputtering, vapour deposition or by electrodeposition. The contacts 5 are in electrical contact with the metallic layer 63. The metallic layer 63 is enclosed by a further metallic layer 64.

In addition, in this exemplary embodiment the top outcoupling region 8 is roughened. This improves outcoupling efficiency. The dielectric layer 4 is also arranged laterally on the semiconductor layer sequence 2. This assists in electrical insulation of the light-emitting diode chip 1.

FIG. 2A is a plan view of a regular grid 52, with contacts 5 arranged at the nodes thereof in the form of separate contact points 51. The spacing a between two neighbouring contact points 51 corresponds to the grid constant of the grid 52.

Figure 2B:
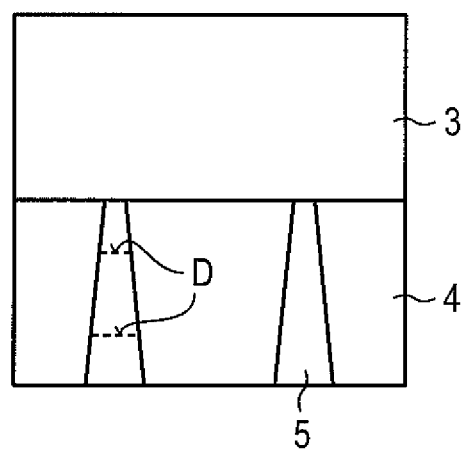
FIG. 2B is a cross-sectional representation of conical contacts, which pass through a dielectric mirror layer.

FIG. 2B is a cross-sectional representation of contacts 5 which are passed through a dielectric mirror layer 4 and are conical in form. As the distance from the current spreading layer 3 and thus also from the semiconductor layer sequence 2 increases, so the cross-sectional area D of the contacts 5 increases. This results in the thermal conductivity of the contacts 5 increasing with increasing distance from the current spreading layer 3. In the vicinity of the current spreading layer 3 the contacts 5 have a smaller cross-sectional area D and thus a lower absorbency for impinging radiation.

Figure 3A:
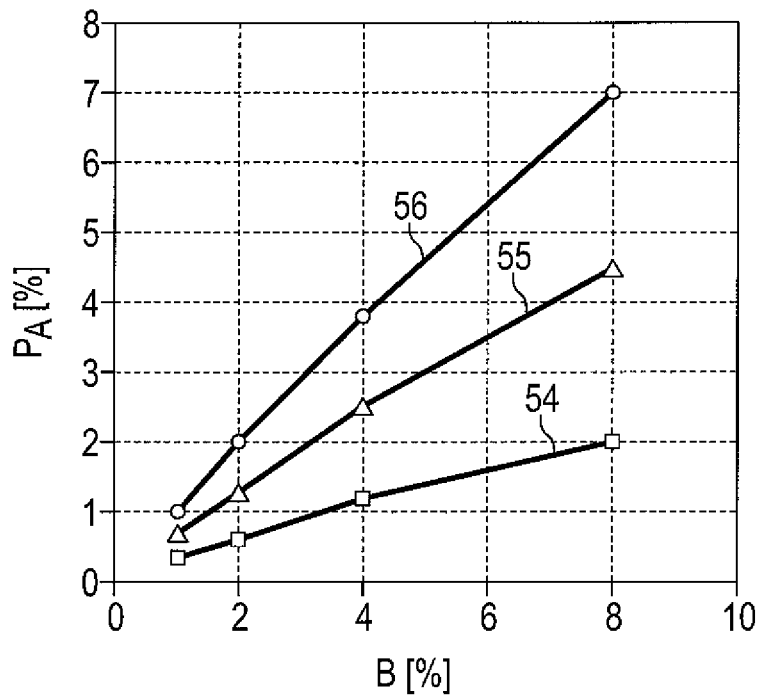
FIG. 3A shows a line graph illustrating power loss due to absorption of the generated radiation at the contacts as a function of the surface coverage of the contacts.
Figure 3B:
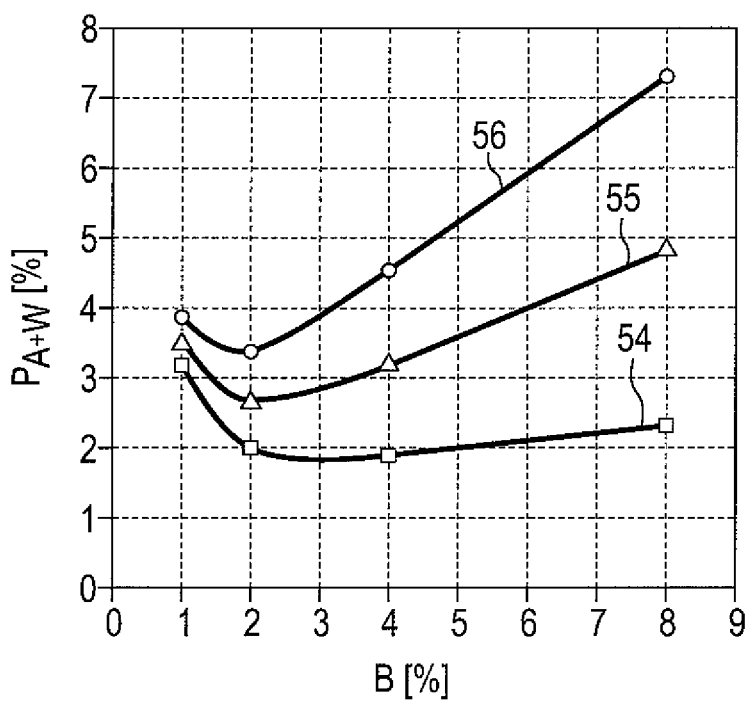
FIG. 3B shows a line graph illustrating power loss due to absorption and resistivity of the contacts as a function of the surface coverage of the contacts.

FIGS. 3A and 3B show optimisation of the contacts in terms of their surface coverage.

In FIG. 3A the power loss $P_A$ resulting from absorption of the radiation at the contacts is plotted against the surface coverage B of the contacts for contacts of various materials 54, 55, 56. The power loss $P_A$ was calculated for optimum silver contacts 54, real silver contacts 55 and aluminium contacts with a 1.0 nm thick bonding layer of titanium 56. In the case of real silver contacts 55 account is taken of the fact that, unlike with optimum silver contacts 54, the roughness of the surface leads to additional absorption losses.

It is clear from FIG. 3A that the power loss $P_A$ increases for all the contact materials 54, 55, 56 as the surface coverage B increases. All in all, the absorption of the radiation is lowest for the optimum silver contacts 54. Absorption is somewhat greater for the real silver contacts 55 and at its greatest for aluminium contacts with a titanium bonding layer 56.

For the calculation it was assumed that the contacts are arranged at the nodes of a regular grid with a grid constant of 12.5 μm. The radiation generated in the active zone 21 has a wavelength of 460 nm.

In FIG. 3B the power loss $P_{A+W}$ of a light-emitting diode chip is plotted, which arises as a result of absorption of the radiation at the contacts and as a result of the electrical resistivity between the current spreading layer and the contacts. The power loss $P_{A+W}$ was calculated as a function of the surface coverage B of the contacts.

Contacts of the contact materials 54, 55, 56 according to FIG. 3A were again considered here. Here too, the power loss $P_{A+W}$ is at its lowest for the optimum silver contacts 54 over the entire region of the surface coverage B, with the power loss $P_{A+W}$ being somewhat greater for the real silver contacts 55 and at its greatest for aluminium contacts with a titanium bonding layer 56. For all the contact materials 54, 55, 56 a minimum power loss $P_{A+W}$ is achieved with a surface coverage in the range from 2%-4%. This results in the optimum value for surface coverage of the contacts.

The calculations are based on a power supply of 2 A/mm$^2$ and a specific contact resistivity $\rho_K$ of an arrangement of TCO layer and contacts of $5 \times 10^{-10}$ Ωm$^2$. The contact resistivity of the arrangement results from the quotient of the specific contact resistivity and the base area of the arrangement. By pretreatment of the TCO layer this contact resistivity may be further reduced.

Figure 4A:
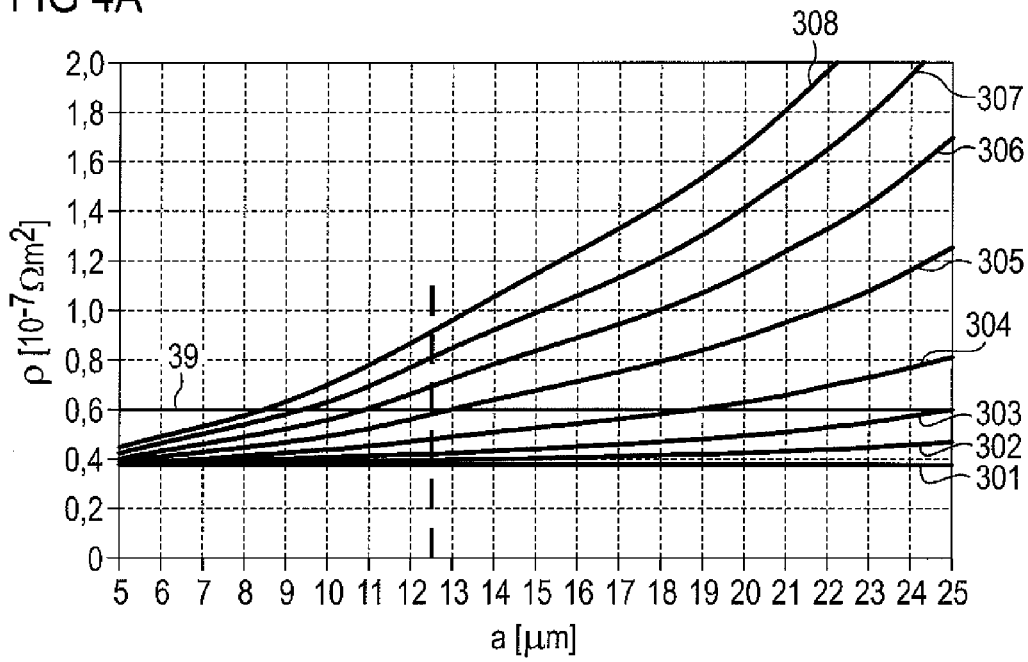
FIG. 4A shows a line graph illustrating optimisation of the contact spacing for different current spreading layers.

FIG. 4A shows optimisation of the spacing a of neighbouring contact points for a fixed surface coverage of the contacts. To this end, the specific contact resistivity $\rho_K$ of an arrangement of p-doped gallium nitride layer, TCO layer and contacts was calculated as a function of the contact spacing a. Different TCO layers 31, 32, 33, 34, 35, 36, 37, 38 with the surface resistivities $\rho_s$=50, 100, 200, 400, 800, 1200, 1600 and 2000 Ω/sq were taken into account. The surface resistivity $\rho_s$ corresponds to the resistivity of a thin square layer, in which the current flow takes place between two electrodes which are arranged at opposing edges of the layer. To clarify that $\rho_s$ is the surface resistivity of a thin square layer, it is conventionally assigned the unit Ω/sq. The calculation was carried out for contact points which are arranged at the nodes of a square grid with the grid constant a.

Where contact spacings a are small, the specific contact resistivities $\rho_K$ of the arrangements approach a value of around $4 \times 10^{-8}$ Ωm$^2$. This value corresponds to the specific contact resistivity $\rho_K$ between the semiconductor layer and the TCO layer, and between the TCO layer and the contacts. For larger contact spacings the specific contact resistivity $\rho_K$ increases due to current spreading in the TCO layer.

In this respect, the specific contact resistivity $\rho_K$ should not become too great, since otherwise the efficiency of the light-emitting diode chip is impaired. The inventors have established that $\rho_K$ should rise by 50% at most due to current spreading. This corresponds to a maximum specific contact resistivity $\rho_K$ of around $6\times10^{-8}$ $\Omega m^2$, which is shown in FIG. 4A by a horizontal line 39. For a TCO layer with the surface resistivity $\rho_s$=800 $\Omega$/sq (curve 35), a maximum contact spacing a of around 12.5 µm is obtained from the point of intersection of the curve 35 with the maximum specific contact resistivity $\rho K$ 39.

Figure 4B:
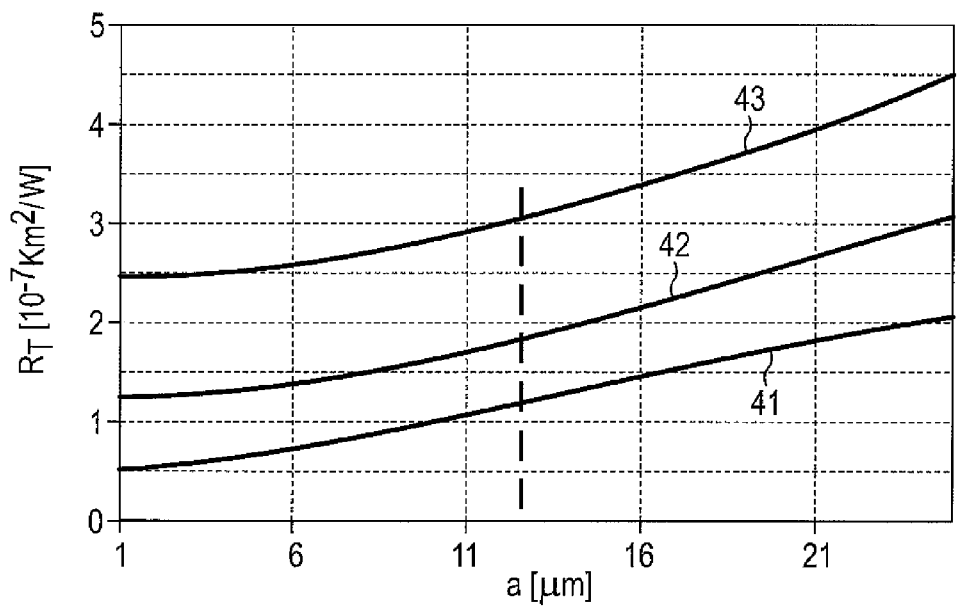
FIG. 4B shows a line graph illustrating the thermal resistivities of contacts which pass through dielectric layers as a function of the contact spacing.

In FIG. 4B the thermal resistivity $R_T$ of an arrangement of dielectric layer with contacts passed through it is plotted as a function of the contact spacing a.

In the arrangement according to FIG. 1A the heat generated in the active zone 21 is dissipated via the p-doped semiconductor layer 23, the contacts 5 and the carrier 6. The dielectric layer 4 contributes only little to heat dissipation as a result of its low thermal conductivity. For example, thermal conductivity is in the range from 1 W/mK for a dielectric layer 4 of silicon dioxide. The contacts 5 preferably exhibit high thermal conductivity. For silver contacts a thermal conductivity is obtained of around 400 W/mK. The semiconductor layer exhibits a thermal conductivity of around 130 W/mK.

In FIG. 4B the thermal resistivity $R_T$ was calculated for dielectric layers of silicon dioxide with the thicknesses 400 nm (curve 41), 1000 nm (curve 42) and 2000 nm (curve 43). The surface coverage of the contacts here amounts in each case to 2.5% of the semiconductor layer. The semiconductor layer exhibits a thickness of around 4 µm.

For contact spacings a <6 µm a plateau is in each case reached in the thermal resistivity $R_T$, which substantially reflects the surface coverage and thermal conductivity of the contacts. Where contact resistivities are relatively large, the thermal resistivity $R_T$ increases due to thermal expansion in the semiconductor layer. With the contact spacing a derived from FIG. 4A in the range from 12.5 µm, the increase in the thermal resistivity $R_T$ due to thermal expansion is less than 50% of the plateau value for real silver contacts 42 and for aluminium contacts with a titanium bonding layer 43. In this way, a contact spacing a of 12.5 µm also proves favourable with regard to thermal conductivity.

Figure 5:
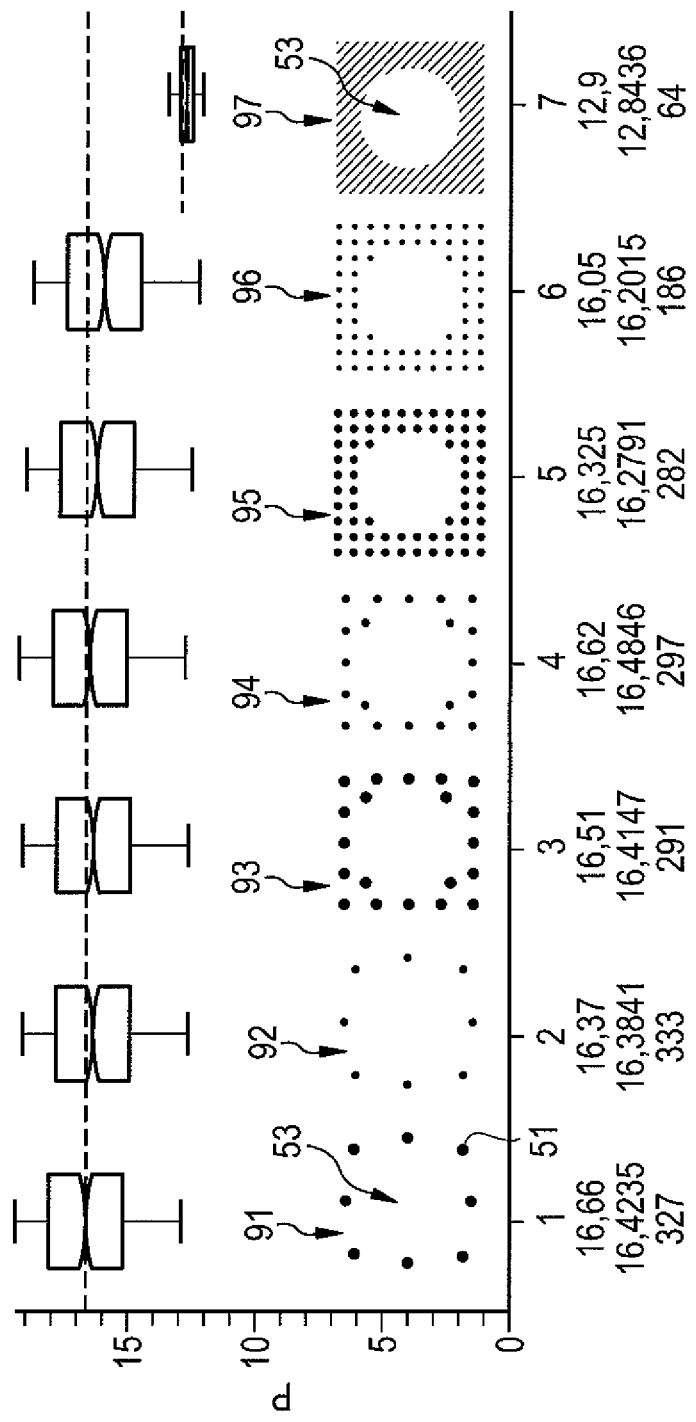
FIG. 5 is a plan view of different possible embodiments of the arrangement of contacts at the nodes of regular grids and the resultant outcoupling efficiencies.

FIG. 5 is a plan view of various embodiments 91, 92, 93, 94, 95, 96 for contacts which are arranged at the nodes of regular grids 52. In this case, the arrangements 91 and 92 have identical grid constants, but different surface coverages of the contacts. This also applies to the arrangements 93 and 94, and the arrangements 95 and 96. All the contact structures 91-96 comprise a free region 53, at which neighbouring nodes are not occupied by contact points 51. In addition, a large-area contact structure 97 is illustrated, which likewise comprises a free region 53.

For arrangements 91-97 shown, the emitted light outputs P were measured. In this case, a series of components were measured for each arrangement and a mean calculated. The measurement results are in each case plotted in scale units above the arrangements 91-97 shown. Under the arrangements the median, the mean and the number of components measured are stated in each case. It is clear from FIG. 5 that the average light outputs P of the point-type contact structures 91-96 are around 30% higher than the light output of the large-area contact 97.

In the arrangements measured, the contact structures are not connected with a current spreading layer, but rather directly with a semiconductor layer.

Figure 6A:
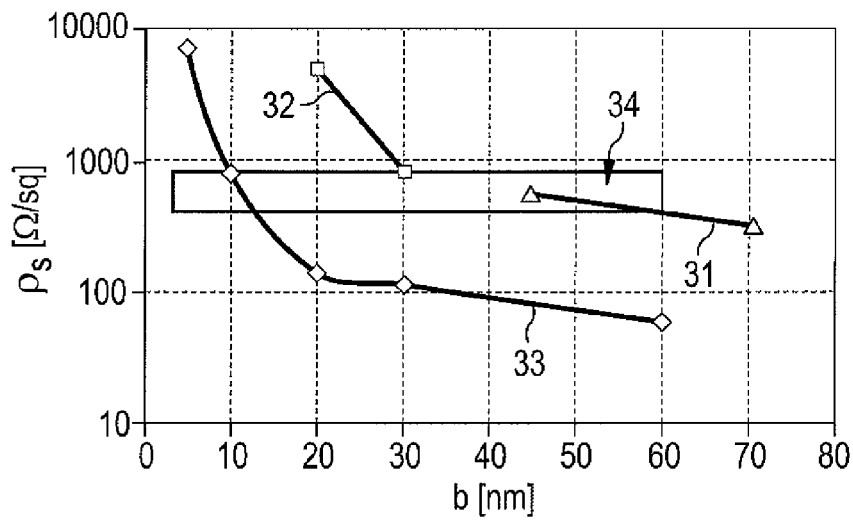
FIG. 6A shows a line graph illustrating the transverse conductivity of different TCO materials as a function of the thickness of the TCO layer.

In FIG. 6A the surface resistivities $\rho_s$ of current spreading layers of ZnO 31, ITO 32 and IZO 33 are plotted as a function of the respective layer thickness b. As is clear from the figure, a surface resistivity $\rho_s$ in a range 34 about a value of $\rho_s$=800 $\Omega$/sq may be achieved for all the TCO layers 31, 32, 33. This value for the surface resistivity ρs results in FIG. 4A in a favourable contact spacing a of around 12.5 µm.

FIG. 6A gives a minimum thickness in the range of 40 nm for the ZnO layer 31, a minimum thickness in the range of 30 nm for the ITO layer 32 and a minimum thickness in the range of 15 nm for the IZO layer 33.

Figure 6B:
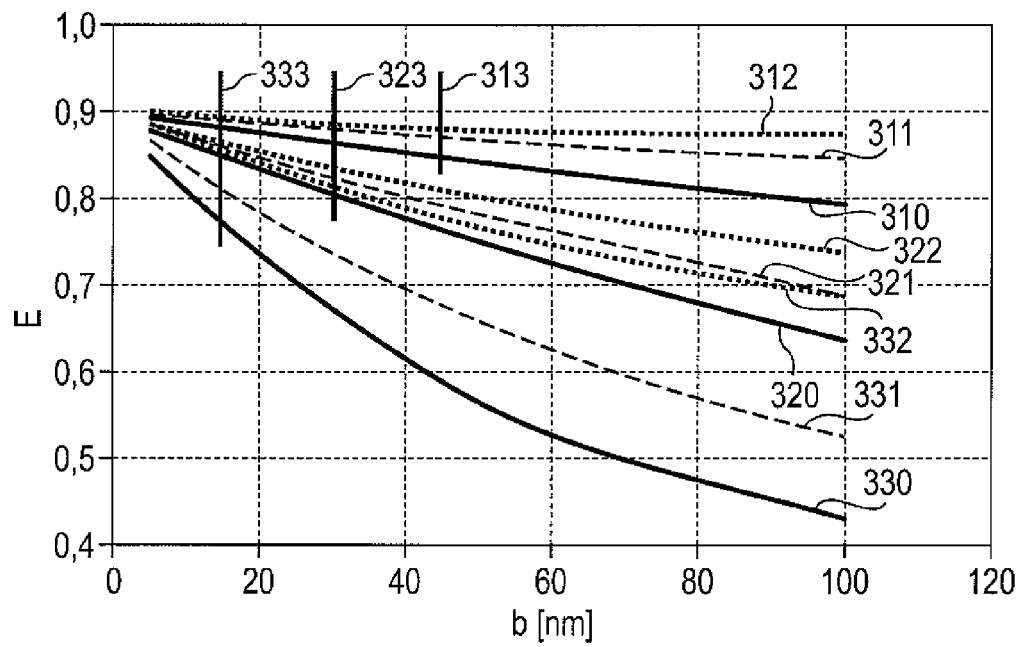
FIG. 6B shows a line graph illustrating the outcoupling efficiencies of different TCO materials and for different wavelengths as a function of the thickness of the TCO layer.

FIG. 6B shows the outcoupling efficiency E of light-emitting diode chips as a function of the thickness b of the TCO layer. In this case, light-emitting diode chips with different TCO layers and with different wavelengths of generated radiation were considered. The outcoupling efficiency E is plotted for ZnO (310, 311, 312), ITO (320, 321, 322) and IZO layers (330, 331, 332) and for radiation with a wavelength of 440 nm (310, 320, 330), 460 nm (311, 321, 331) and 530 nm (312, 322, 332). All in all, the outcoupling efficiency E is at its greatest for the ZnO layer. As layer thickness b increases, outcoupling efficiency E decreases. As the wavelength of the radiation increases, outcoupling efficiency E increases. The minimum thicknesses 313, 323, 324 determined from FIG. 6A are additionally plotted here.

The description made with reference to exemplary embodiments does not restrict the invention to these embodiments, but rather encompasses any novel feature and any combination of features. These include in particular any combination of features in the claims, even if this feature or this combination is not itself explicitly indicated in the claims or exemplary embodiments.

The invention claimed is:

1. A light-emitting diode chip with a semiconductor layer sequence, which comprises an active zone for generating electromagnetic radiation, with a current spreading layer, which adjoins the semiconductor layer sequence, with contacts, which electrically contact the current spreading layer, wherein the contacts cover between at least 1% and at most 8% of the surface of the current spreading layer, wherein the cross-sectional areas of the contacts increase with increasing distance from the semiconductor layer sequence, and wherein a free region is arranged centrally relative to a surface of the semiconductor layer sequence at an interface between the current spreading layer and the contacts, said free region being free from the contacts and, in said free region, there is a dielectric layer passing through the current spreading layer and directly adjoining the semiconductor layer sequence.

2. The light-emitting diode chip according to claim 1, wherein the thermal conductivity of the contacts increases with increasing distance from the semiconductor layer sequence.

3. The light-emitting diode chip according to claim 1, wherein the contacts are in conical form.

4. The light-emitting diode chip according to claim 1, wherein the contacts are distributed uniformly over the surface of the current spreading layer.

5. A light-emitting diode chip according to claim 1, wherein a spacing of neighbouring contacts is less than 30 gm.

6. The light-emitting diode chip according to claim 1, wherein the contacts consist of separate contact points.

7. The light-emitting diode chip according to claim 1, wherein the contacts are arranged at nodes of a regular grid.

8. The light-emitting diode chip according to claim 1, wherein the current spreading layer comprises a thickness in the range from at least 10 nm to at most 60 nm.

9. The light-emitting diode chip according to claim 1, wherein the current spreading layer contains indium-zinc oxide and has a thickness of at least 15 nm.

10. The light-emitting diode chip according to claim 1, wherein the current spreading layer contains indium-tin oxide and has a thickness of at least 30 nm.

11. The light-emitting diode chip according to claim 1, wherein the current spreading layer contains zinc oxide and has a thickness of at least 40 nm.

12. The light-emitting diode chip according to claim 1, wherein the contacts pass through a dielectric layer.

13. The light-emitting diode chip according to claim 12, wherein the contacts are connected electrically with a metallic layer, which closes off the dieletric layer in the direction of a carrier.

14. The light-emitting diode chip according to claim 12, wherein said dielectric layer is an air layer.

15. The light-emitting diode chip according to claim 12, wherein said dielectric layer comprises a Bragg mirror.

16. The light-emitting diode chip according to claim 1, wherein the contacts cover between at least 2% and at most 4% of the surface of the current spreading layer.

17. The light-emitting diode chip according to claim 16, wherein the thermal conductivity of the contacts increases with increasing distance from the semiconductor layer sequence.

* * * * *

UNITED STATES PATENT AND TRADEMARK OFFICE
CERTIFICATE OF CORRECTION

PATENT NO. : 8,530,923 B2
APPLICATION NO. : 12/922830
DATED : September 10, 2013
INVENTOR(S) : Sabathill et al.

It is certified that error appears in the above-identified patent and that said Letters Patent is hereby corrected as shown below:

In the Claims

Column 8, claim 5, line 1, change "A" to --The--.

Column 8, claim 5, line 3, change "gm" to --µm--.

Signed and Sealed this
Eighteenth Day of February, 2014

Michelle K. Lee
*Deputy Director of the United States Patent and Trademark Office*